United States Patent
Radet et al.

(10) Patent No.: US 8,907,947 B2
(45) Date of Patent: Dec. 9, 2014

(54) METHOD AND SYSTEM FOR NAVIGATING IN A PRODUCT STRUCTURE OF A PRODUCT

(75) Inventors: Emmanuel Denis Radet, Ville d'Avray (FR); Alain Georges Dugousset, Antony (FR); Juba Hadjali, Aulnay-sous-Bois (FR); Iver Boris Bailly-Salins, Fontainebleau (FR)

(73) Assignee: Dassault Systèmes, Velizy-Villacoublay, Cedex (FR)

( * ) Notice: Subject to any disclaimer, the term of this patent is extended or adjusted under 35 U.S.C. 154(b) by 921 days.

(21) Appl. No.: 12/636,874

(22) Filed: Dec. 14, 2009

(65) Prior Publication Data

US 2011/0141109 A1 Jun. 16, 2011

(51) Int. Cl.
| | |
|---|---|
| G06T 17/00 | (2006.01) |
| G06F 17/50 | (2006.01) |
| G06F 3/0481 | (2013.01) |
| G06T 19/00 | (2011.01) |

(52) U.S. Cl.
CPC .............. *G06F 17/50* (2013.01); *G06F 3/0481* (2013.01); *G06T 19/003* (2013.01)
USPC ........................................................ 345/420

(58) Field of Classification Search
USPC .......................................... 345/420; 715/850
See application file for complete search history.

(56) References Cited

U.S. PATENT DOCUMENTS

| | | | |
|---|---|---|---|
| 2005/0097108 A1* | 5/2005 | Wang et al. .................... | 707/100 |
| 2006/0218478 A1* | 9/2006 | Nonclercq et al. ............. | 715/500 |
| 2007/0159480 A1* | 7/2007 | Delarue et al. ................. | 345/427 |

* cited by examiner

*Primary Examiner* — Kee M Tung
*Assistant Examiner* — Peter Hoang
(74) *Attorney, Agent, or Firm* — Hamilton, Brook, Smith and Reynolds, P.C.

(57) ABSTRACT

The invention is directed to a method for navigating in a product structure of a product, the product comprising a set of three-dimensional modeled objects. The method comprises: (a) displaying a three-dimensional graphical representation of the product; (b) selecting a three-dimensional modeled object of the product; and (c) displaying a graphical representation of a number of levels of a hierarchy of the product structure of the product. The number of levels is determined according to levels identified in a simple path in the hierarchy of the product structure between the selected three-dimensional modeled object and a highest level of the hierarchy. The method selects a level among levels identified in the simple path in the hierarchy of the product structure of the product; and finds, in the set of three-dimensional modeled objects, a second set of three-dimensional modeled objects according to the selected level of the hierarchy. Display of the found second set of three-dimensional modeled objects is then emphasized in the screen view (i.e., user interface).

18 Claims, 5 Drawing Sheets

METHOD AND SYSTEM FOR NAVIGATING IN A PRODUCT STRUCTURE OF A PRODUCT

BACKGROUND OF THE INVENTION

The invention relates to the field of computer programs and systems, and more specifically to a method for navigating in a product structure of a product, wherein said product comprises a set of three-dimensional modeled objects.

Computer-aided techniques are known to include Computer-Aided Design or CAD, which relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations.

A number of systems and programs are offered on the market for the design of objects (or parts) or assemblies of objects, forming a product, such as the one provided by Dassault Systèmes under the trademark CATIA. These CAD systems allow a user to construct and manipulate complex three dimensional (3D) models of objects or assemblies of objects. CAD systems thus provide a representation of modeled objects using edges or lines, in certain cases with faces. Lines or edges may be represented in various manners, e.g. non-uniform rational B-splines (NURBS). These CAD systems manage parts or assemblies of parts as modeled objects, which are mostly specifications of geometry. Specifically, CAD files contain specifications, from which geometry is generated, which in turn allow for a representation to be generated. Geometry and representation may be stored in a single CAD file or multiple ones. CAD systems include graphic tools for representing the modeled objects to the designers; these tools are dedicated to the display of complex objects—the typical size of a file representing an object in a CAD system being in the range of one Megabyte per part, and an assembly may comprise thousands of parts. A CAD system manages models of objects, which are stored in electronic files.

In computer-aided techniques, the graphical user interface (GUI) plays an important role as regards the efficiency of the technique. Most of the operations required for manipulating and/or navigating the objects may be performed by the user (e.g. the designers) on the GUI. Especially, the user may create, modify, and delete the objects forming the product, and also explore the product so as to comprehend how objects are interrelated, e.g. a product structure. The product structure is a hierarchical decomposition of the product wherein relationships of the modeled objects forming the product are arbitrarily settled by the user. Traditionally, the product structure is represented as tree, thus forming a so called "product structure tree". The operations performed on the objects are carried out through dedicated menus and icons which are located on the sides of the GUI. Recently, CAD systems such as CATIA allow calling and displaying these functions nearby the representation of the product. The designer does not need anymore to move the mouse towards menus and icons. Operations are thus available within reach of the mouse. In addition, the operations behave semantically: for a given operation selected by the designer, the CAD system may suggests to the designer, still nearby the mouse, a set of new operations according to the former selected operation that the designer is likely to select.

Also known are Product Lifecycle Management (PLM) solutions, which refer to a business strategy that helps companies to share product data, apply common processes, and leverage corporate knowledge for the development of products from conception to the end of their life, across the concept of extended enterprise. By including the actors (company departments, business partners, suppliers, Original Equipment Manufacturers (OEM), and customers), PLM may allow this network to operate as a single entity to conceptualize, design, build, and support products and processes.

Some PLM solutions make it for instance possible to design and develop products by creating digital mockups (a 3D graphical model of a product). The digital product may be first defined and simulated using an appropriate application. Then, the lean digital manufacturing processes may be defined and modeled.

The PLM solutions provided by Dassault Systèmes (under the trademarks CATIA, ENOVIA and DELMIA) provides an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Such PLM solutions comprise a relational database of products. The database comprises a set of textual data and relations between the data. Data typically include technical data related to the products said data being ordered in a hierarchy of data and are indexed to be searchable. The data are representative of the modeled objects, which are often modeled products and processes.

In order to work on a product, a user has to be able to know and identify one or more objects (or parts) of the product. In almost all CAD systems, the products are displayed in one or both of two ways. The first way is a 3D representation of all part of the product; this is the most common view of the product. The second way is based on a specification tree which shows a two-dimensional (2D) representation of the product structure. Most of the time, bidirectional behaviors are implemented to enable the user to visualize correspondences between the product structure and 3D representations, and understand the product structure and physical assembly. For instance, using cross highlight capability, the user can either select a 3D part of the 3D representation of the product or a 2D node of the 2D representation of the product structure, and discover its respective 2D or 3D corresponding node or part which is highlighted. However, the highlighting may be performed only if the selected 2D node is visible on the screen and not outside of the virtual field of view due to previous zooming operations in the 3D view.

For navigating the product structure, the user can use functionalities such as "Reframe on" from 2D product structure tree in order to retrieve the 3D part of the selected node. By using this command, the user is able to center an object in the 3D part, by right-clicking the object, either in the 3D or in the 2D tree, and selecting "Reframe On". The object is then centered in the 3D and fills the viewer. Another functionality is "Center graph" from 3D representation to center the 2D product structure tree on the node containing the selected geometry. The Center graph functionality locates the object in the 2D product structure tree. The 2D product structure tree is expanded down to the selected object's node and is located at the center of the screen. The object is also selected in the 3D representation of the product.

However, the user needs to iteratively repeat this operation level by level, node by node to obtain a complete understanding of the product. This process is thus laborious and time consuming for the user.

Moreover, 3D products get more complex: for instance, a plane may comprise millions and millions of parts, and while the 3D view of the product is immediate and intuitive, it is often partial as, most of the time, the user works on a limited number of parts of the product. Thus, the corresponding 2D product structure tree gets bigger, denser, and are therefore not immediately apprehensible as they comprise all the parts of the product. The navigation of the 2D product structure tree involves expending and collapsing the tree views, which is cumbersome and not intuitive for the user.

In addition, 3D products involve more users in a collaborative environment, and it is therefore more difficult for a user to understand and reuse an existing product which he/she has not designed himself. Thus, the user needs to navigate the 2D product structure in order to comprehend modifications of the product performed by the other users.

Moreover, no CAD users, such as customers, product architect, etc. are using most of the time "only" 3D, and are not looking at complex specification trees. Thus, they do not need and want to navigate the 2D representation of the product structure.

Furthermore, when a user wants to discover and understand an existing product structure, he/she needs to study a complex specifications tree which may take place on the screen and hinder the simultaneous 3D representation. Thus, the view of the 3D representation is disturbed by the 2D product structure.

Therefore, according to the limitations of the existing solution shortly discussed above, there is a need for improving the exploration and the understanding of the product structure of a product.

SUMMARY OF THE INVENTION

The invention therefore provides a method for navigating in a product structure of a product, the product comprising a set of three-dimensional modeled objects. The method comprises displaying a three-dimensional graphical representation of the product, selecting a three-dimensional modeled object of the product, displaying a graphical representation of a number of levels of a hierarchy of the product structure of the product, the number of levels being determined according to levels identified in a simple path in the hierarchy of the product structure between the selected three-dimensional modeled object and a highest level of the hierarchy, selecting a level among levels identified in the simple path in the hierarchy of the product structure of the product, finding, in the set of three-dimensional modeled objects, a second set of three-dimensional modeled objects according to the selected level of the hierarchy, emphasizing the display of the found second set of three-dimensional modeled objects.

The method according to the invention may comprise one or more of the following features:
  the second set comprises the three-dimensional modeled objects of a subtree of the selected level of the hierarchy;
  the subtree of the selected level of the hierarchy is comprised of the selected level of the hierarchy and descendants of the selected level of the hierarchy;
  the selection of the three-dimensional modeled object of the product is carried out by user acting on the displayed three-dimensional graphical representation of the product with a haptic device;
  the graphical representation of the number of levels is a user-interactive graphical tool;
  the step of selecting a level among levels identified in the simple path in the hierarchy is carried out by the user through the user-interactive graphical tool;
  the user-interactive graphical tool comprises at least one user-selectable area suitable for the selection by the user of a level among levels identified in the simple path in the hierarchy;
  the selection of a level is carried out when a haptic device passes over the user-interactive graphical tool;
  the number of user-selectable areas suitable for the selection of a level equals the determined number of levels;
  the user-interactive graphical tool comprises an area in which the three-dimensional modeled objects of the second set are represented;
  the step of displaying a graphical representation of the number of levels comprises displaying a unique graphical representation for each level identified, said unique graphical representation for each level identified being representative of the position of the level in the hierarchy;
  the size of said unique graphical representation for each level identified is representative of the position of the level in the hierarchy;
  the step of emphasizing the display of the found second set of three-dimensional modeled objects comprises modifying a rendering of the objects of the found second set;
  the step of emphasizing the display of the found second set of three-dimensional modeled objects comprises modifying a rendering of objects of the set of three-dimensional modeled objects which are not included in the found second set;
  modifying the rendering of objects of the set of three-dimensional modeled objects which are not included in the found second set further comprises modifying the transparency of said objects of the set of three-dimensional modeled objects;
  the step of emphasizing the display of the found second set of three-dimensional modeled objects comprises animating the objects of the found second set;
  the animation of the objects of the found second set is carried out by shaking the objects of the found second set;
  the step of emphasizing the display of the found second set of objects is carried out upon user actuation on the graphical representation of the number of levels of the hierarchy of the structure of the product.

The invention further proposes a computer-readable storage medium storing instructions that, when executed by a computer, cause the computer to perform a method for navigating in a product structure of a product, the product comprising a set of three-dimensional modeled objects. The method comprises displaying a three-dimensional graphical representation of the product, selecting a three-dimensional modeled object of the product, displaying a graphical representation of a number of levels of a hierarchy of the product structure of the product, the number of levels being determined according to levels identified in a simple path in the hierarchy of the product structure between the selected three-dimensional modeled object and a highest level of the hierarchy, selecting a level among levels identified in the simple path in the hierarchy of the product structure of the product, finding, in the set of three-dimensional modeled objects, a second set of three-dimensional modeled objects according to the selected level of the hierarchy, emphasizing the display of the found second set of three-dimensional modeled objects.

The invention still concerns a system for navigating in a product structure of a product, the product comprising a set of three-dimensional modeled objects. The system comprises a storage for the set of three-dimensional modeled objects, a means for displaying to a user a three-dimensional graphical representation of the product, a processor adapted to carry out a method for navigating said product structure of the product, the method comprising the steps of:

displaying a three-dimensional graphical representation of the product;

selecting a three-dimensional modeled object of the product;

displaying a graphical representation of a number of levels of a hierarchy of the product structure of the product, the number of levels being determined according to levels identified in a simple path in the hierarchy of the product structure between the selected three-dimensional modeled object and a highest level of the hierarchy;

selecting a level among levels identified in the simple path in the hierarchy of the product structure of the product;

finding, in the set of three-dimensional modeled objects, a second set of three-dimensional modeled objects according to the selected level of the hierarchy;

emphasizing the display of the found second set of three-dimensional modeled objects.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

A system embodying the invention will now be described, by way of non-limiting example, and in reference to the accompanying drawings, where.

DETAILED DESCRIPTION OF THE INVENTION

Figure 1:
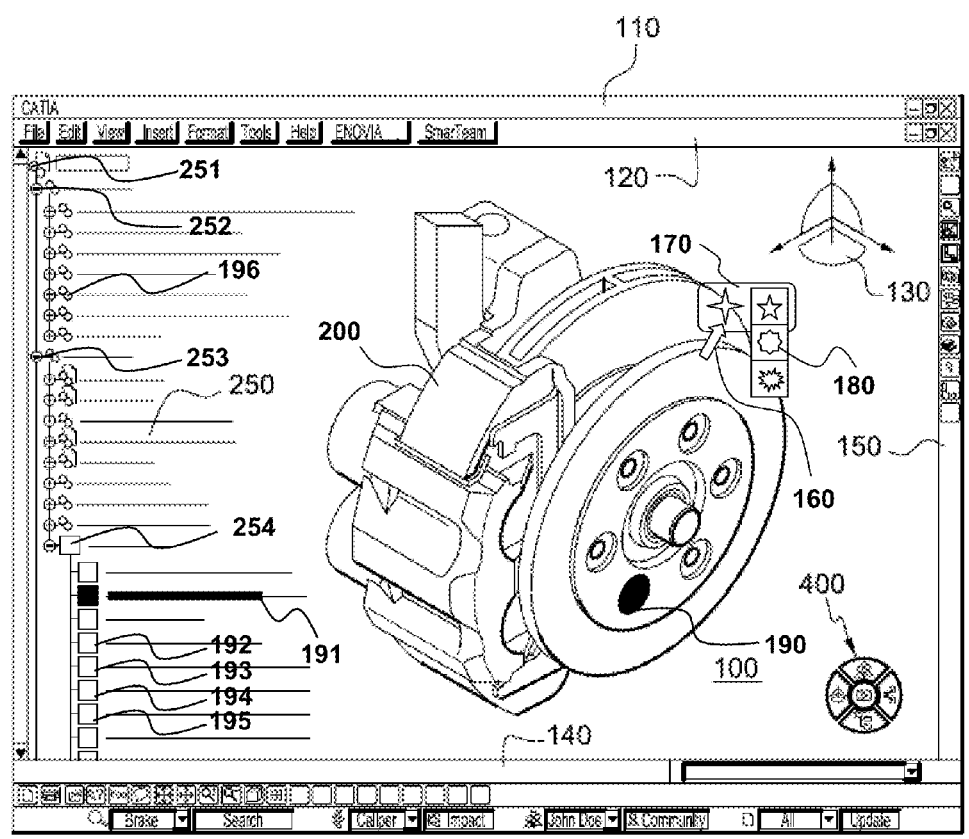
FIG. 1 is an example of views of graphical user interface.

A description of example embodiments of the invention follows.

The teachings of all patents, published applications and references cited herein are incorporated by reference in their entirety.

The invention is directed to a method for navigating in a product structure of a product, the product comprising a set of three-dimensional modeled objects. The product structure of a product is a hierarchical decomposition of the product wherein relationships of the modeled objects forming the product are arbitrarily settled by the user. The product structure is a tree, thus forming a so called "product structure tree" which is comprised of leaves and nodes.

The method of the disclosed technology comprises a first step of displaying a three-dimensional graphical representation of the product. Then, a three-dimensional modeled object of the product is selected. Typically, the selection may be performed upon user actuation with a haptic device on the graphical representation of the object, e.g. the cursor of a mouse. Next, a graphical representation of a number of levels of a hierarchy of the product structure of the product is displayed. The number of levels is determined according to levels identified in a simple path in the hierarchy of the product structure between the selected three-dimensional modeled object and a highest level of the hierarchy. The simple path is a path in the hierarchy of the product structure with no repeated vertices. The simple path starts from the leaf of the selected three dimensional modeled object and stops at the highest level of the hierarchy, e.g. the root of the product structure. The simple path allows the method identifying at least two nodes of the product structure. That is, at least two levels are identified. Thus, as the simple path has no repeated vertices, each node traversed when passing through the simple path is a level of the hierarchy of the product structure tree. Then a level is selected among the levels identified in the simple path of the hierarchy of the product structure of the product. Typically, the user may select the level. Next, a second set of three-dimensional modeled objects is found in the set of three-dimensional modeled objects, according to the selected level of the hierarchy. Finally, the display of the found second set of three-dimensional modeled objects is emphasized.

The disclosed method thus allows improving many aspects of the navigation, the exploration, and the understanding of the product structure of a product. Especially, the disclosed technology allows navigating and exploring the product structure without requiring any 2D specification tree. Indeed, the navigation relies on the graphical representation of the modeled objects of the product (the displayed product) and the graphical representation of a number of levels of the hierarchy of the product structure. Furthermore, the understanding of the product structure is made easier as the amount of information related to the product structure and displayed to the user is limited. For instance, siblings of the selected level of the hierarchy are no more displayed, which advantageously increases the overall comprehension of the product structure.

In reference to FIG. 1, the exemplified graphical user interface (or GUI) 100 may be a typical CAD-like interface, having standard menu bars 110, 120, as well as bottom and side toolbars 140, 150. Such menu and toolbars contain a set of user-selectable icons, each icon being associated with one or more operations or functions, as known in the art.

Some of these icons are associated with software tools, adapted for editing and/or working on a modeled product 200 or parts of product 200 such as that displayed in the GUI 100. In the following description, "product", "part", "assembly" and the like may be referred to as "part" for the sake of simplicity. Note that the concept of "part" can in fact be generalized to that of "object", wherein an object can be only a "physical" part of the designed product or, more generally, any software tool participating in the design process (but not necessarily "in" the final product).

The software tools may be grouped into workbenches. Each workbench comprises a subset of software tools. In particular, one of the workbenches is an edition workbench, suitable for editing geometrical features of the modeled product 200. In operation, a designer may for example pre-select a part of the object 200 and then initiate an operation (e.g. change the dimension, color, etc.) or edit geometrical constraints by selecting an appropriate icon. For example, typical CAD operations are the modeling of the punching or the folding of a 3D modeled object displayed on the screen.

The GUI may for example display data 250 related to the displayed product 200. In the example of FIG. 1, the data 250, displayed as a "product structure tree", and their 3D representation 200 pertain to a brake assembly including brake caliper and disc. The product structure of a product is a hierarchical decomposition of the product wherein relationships of the objects forming the product are arbitrarily settled by the user. The product structure is represented as tree, thus forming a so called "product structure tree". In the following description, "product structure tree" refers to "product structure" for the sake of simplicity. The product structure tree 250 is comprised of leaves 191-195 which identify and represent modeled objects forming the 3D representation of the product 200, and nodes 251-254 which identify sub-assemblies of modeled objects and express relationships which are arbitrarily settled by the user. Leaves 191-195 of the product structure tree 250 are particular nodes in that a leaf is a hard link to a modeled object, while a node is symbolic (or virtual) link to a modeled object. The data structure of the product structure is hierarchical and nodes 191-195, 251-254 of the product structure tree are arranged in a parent-child relationship. For instance, the node 251 is the highest node in the hierarchy (also called root node) and defines parent-child relationships with its descendants 252-253. The node 253 also defines a parent-child relationship with its descendant node 254, which in turn defines parent-child relationships with its descendant nodes, the leaves 191-195. The parent node 254 of the leaves 191-195 may represent a sub-assembly (or subtree) that contains the leaves 191-195.

In FIG. 1, one can note that the bidirectional behavior is implemented and enables the user to visualize correspondences between the product structure 250 and 3D representations 200. For instance, the node 191 of the product structure 250 and the modeled object 190 of the 3D representation of the displayed product 200 are highlighted.

The GUI may further show various types of graphic tool 130, 160, for example for facilitating 3D orientation of the object, for triggering a simulation of an operation of an edited product or render various attributes of the displayed product 200.

In addition, the one or more operations or function may be selected directly nearby the modeled product 200 or parts of product 200 displayed in the GUI 100. To this aim, a user-selectable icon 170 associated with operations or functions may appear near a selector 160, e.g. the cursor of a haptic device. The user may pass the cursor 160 over the icon 170 which, in response, displays a set of icons 180. Typically, the user-selectable icons 170, 180 may have the form of a balloon. Then the user selects one of the icons of the set of icons 180 in order to perform a function associated with said selected icon. Furthermore, the set of icons 180 behave semantically, that is, the set of icons 180 is suggested by the CAD system according to the operation the user is supposed to perform next.

Figure 2:
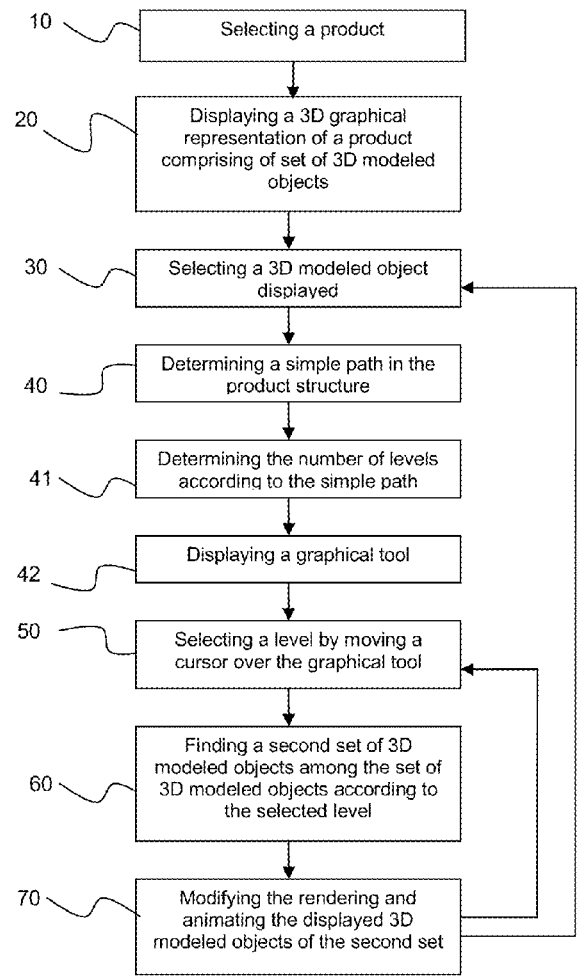
FIG. 2 is a flowchart of a method for navigating in a product structure of a product according to the invention.

Referring to FIG. 2, a flowchart shows a procedure for navigating in a product structure of a product which is comprised of a set of three-dimensional modeled objects. The procedure starts with the selection of a product (step 10) and the display of a 3D graphical representation of the product (step 20). These operations may be performed in the GUI 100 in reference to FIG. 1. The selection of the product may be automatically performed, or upon user action.

The 3D modeled objects of the product are displayed. A 3D modeled object is a description of an object in a 3D space. A 3D space is a geometric model of a physical universe, which may be mathematically represented by a geometry which describes every point in 3D space by means of coordinates. Incidentally, other ways of describing 3D space exist. A 3D modeled object refers essentially to specifications, from which geometry is generated, and is a mathematical description depicting of a 3D object. The 3D modeled object is thus modeled by geometrical specifications that allow their display in 3D. That is, a collection of points in 3D space connected by various geometric entities such as triangles, lines, curved surfaces, etc. An object displayed in 3D allows its viewing from all angles. For instance, the object may be handled and turned around any of its axes, or around any axis in the screen. This notably excludes 2D icons, which are not 3D modeled. A 3D modeled object is represented by a 3D representation of the 3D modeled object.

Then, a displayed 3D modeled object of the product is selected (step 30). Typically, the selection may be carried out by a user acting on the displayed 3D graphical representation of the product with a haptic device. The haptic device, e.g. a keyboard, a mouse, a stylus, a touch screen, or the like, may cause a cursor, for instance the cursor 160 of FIG. 1, to be placed over the graphical representation of a 3D modeled object of the displayed product. Then, the haptic device generates a signal to perform the selection of the 3D modeled object over which the cursor is located. The signal may be generated upon actuation of a button of the haptic device, e.g. a button of mouse.

Figure 3:
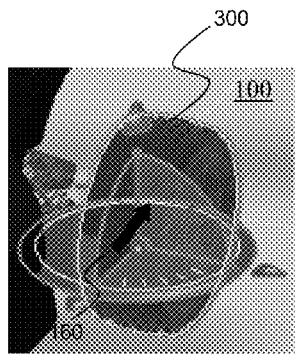
FIGS. 3 and 4 are schematic views of selections of a modeled object of a product.
Figure 4:
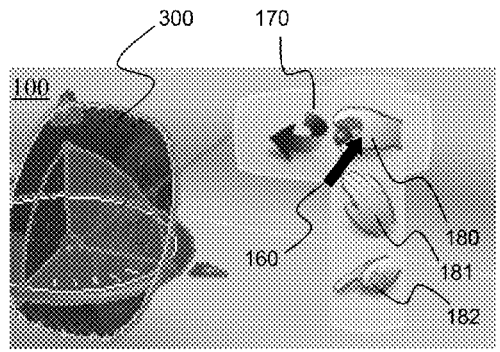
Figure 10:
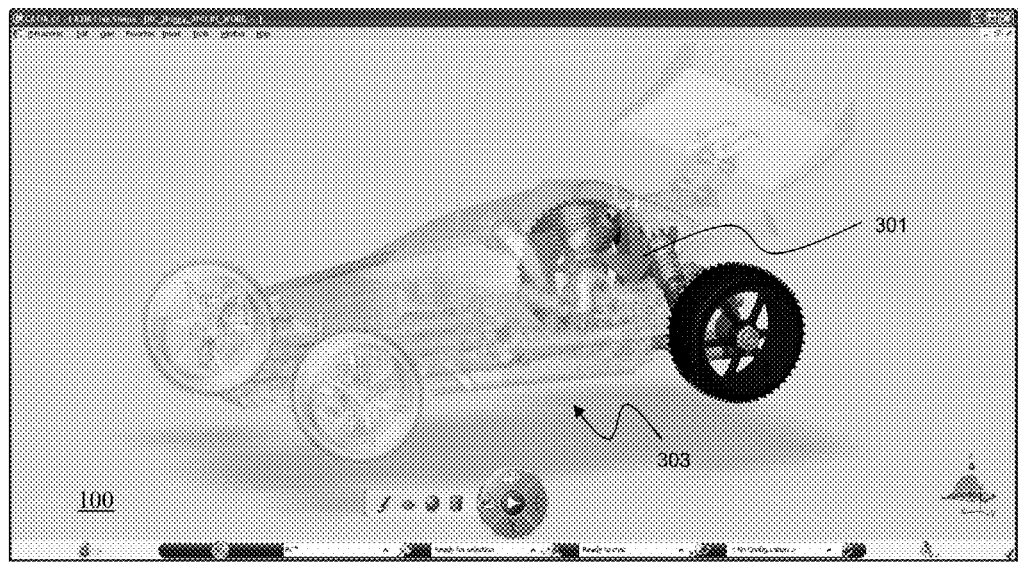
FIG. 10 exemplifies a view of a product structure in the graphical user interface of FIG. 1 that can be displayed according to an embodiment of the invention.

Referring now to FIGS. 3 and 4, examples of selections of modeled objects of the product depicted on FIG. 10 are shown. In FIG. 3, the user has placed the cursor 160 of a mouse over the wheel 300 and has actuated the left button of the mouse to select the wheel 300. Advantageously, the selected object may be emphasized for confirming to the user that it has been selected, e.g. the outline of the selected wheel may be highlighted.

In FIG. 4, menu icons 180-182 appear nearby the 3D modeled object 300 the user wants to select, as seen in reference to FIG. 1. At this stage, the object is not yet selected: the icon menus 180-182 provide to the user several selection modes of objects. The Global Mode, selected with the menu icon 180, extends a selection to all parts of the geometry in contact with the face or surface selected. The Local Mode 181 extends a selection to the face or surface selected; the point selected is not privileged. The Point Mode 182 confines a selection to the point selected.

Next, a graphical representation of a number of levels of a hierarchy of the product structure of the product is displayed (steps 40-42).

To this aim, a simple path is determined in the hierarchy of the product structure (step 40) between the selected three-dimensional modeled object (at step 30) and a highest level of the hierarchy of the product structure. A path in a product structure is a sequence of nodes such that, from each of the nodes of the path, there is an arc to the next node in the sequence. The path is a finite path with a first node (or start node) and a last vertex (or stop node). A simple path is a path in the hierarchy of the product structure with no repeated nodes. Thus, each node successively met during traversing a simple path in the product structure is located on a respective level of the hierarchy of the product structure. In practice, the highest level of the hierarchy of the product structure is the root node.

Next, the number of levels is determined according to levels identified (step 40) in the simple path in the hierarchy of the product structure (step 41). As each node of the simple path is located on a respective level, the number of levels is provided by the number of nodes identified.

Referring back to FIG. 1, the user has selected the leaf 191 in the product structure tree 250. The highest level of the hierarchy is the root node 251 of the product structure 250. The simple path between the leaf 191 and the root node 251 traverses the nodes 191, 254, 253, and 251. Four levels are therefore determined. One can notice that the node 252 is not traversed as it has the same level as the node 253, that is, there is no parent-child relationship between the nodes 253 and 252. If the user would have selected the node 196, then the simple path would be comprised of the nodes 196, 252, and 251. Three levels would be determined in this case.

Then, a graphical tool is displayed (step 42). The graphical tool provides a graphical representation of the number of levels of the hierarchy of the product structure. In practice, the graphical representation of the number of levels comprises a unique graphical representation for each level identified. Furthermore, the unique graphical representation for each level identified may be representative of the position of the level in the hierarchy. The position of the level in the hierarchy may be represented by the size of the respective unique graphical representation of each level. For instance, lower is the level in the hierarchy, smaller is its representation; on the contrary, higher is the level in the hierarchy, larger is its unique graphical representation.

After that, a level is selected (step 50) among levels identified in the simple path (steps 40-41). Typically, the selection is performed by the user. The selection may preferably be performed on the graphical tool which is a user-interactive graphical tool; for instance with a haptic device. To this aim, the user-interactive graphical tool may comprise at least one user selectable area suitable for selecting a level among levels identified in the simple path. Advantageously, the number of user selectable areas is equal to the number levels determined, which allows the user to comprehend easily the number of identified levels in the product structure. In addition, the user interactive selectable area may be emphasized when selected by the user; for instance, the rendering of the selected area may be amended. Incidentally, a level may be pre-selected. Typically, this may occur in response to the selection of the 3D modeled object: in this case, the lowest level is pre-selected and the rendering of the pre-selected area may be amended in order to show the user its pre-selection.

Figure 9:
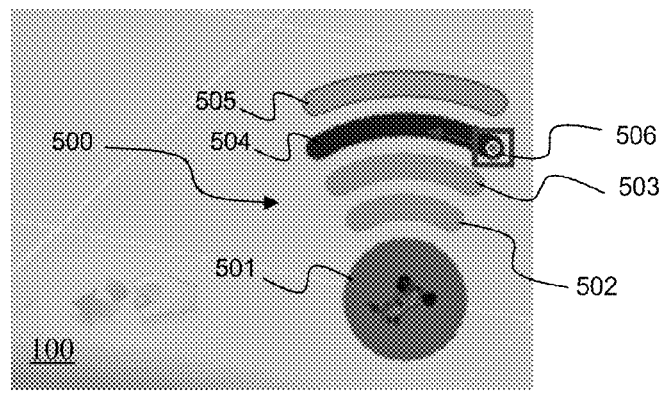
FIG. 9 is a schematic view of a user interactive graphical tool according to the invention.

FIG. 9 illustrates an example of embodiment of a user interactive graphical tool according to the invention. The tool 500 comprises arcs 502, 503, 504, 505 which are substantially concentric. Each arc is the unique graphical representation of a level identified in the simple path. The arcs are located so that their respective position to each other is representative of the position of their respective level in the hierarchy. For instance, the arc 502 represents the lowest level in the hierarchy while the arc 505 represents the root level of the product structure. The arc 503 has an upper level than the arc 502 in the hierarchy of the product structure, and similarly, the arc 504 has an upper level than the arc 503 in the hierarchy of the product structure. In addition, the size of the arcs 502, 503, and 504 is also representative of the position of the level in the hierarchy: the size of their respective surface depends on their respective position in the hierarchy of the product structure. Incidentally, the surface of the highest level 505 (the root level) in the hierarchy may have a respective surface which identical or even smaller than the lower level represented by the arc 504: advantageously, this allows a better distinction of the root level compared to its succeeding level. In addition, the selection of a level may be performed when the cursor passes over an arc. Therefore, the navigation is simpler and smoother as no supplementary action is required to perform the selection. Furthermore, the selected arc 504 may be emphasized in order to confirm to the user its selection, e.g. by modifying its colour.

After the selection of a level (step 50), a second set of three-dimensional modeled objects is found in the set of the three-dimensional modeled objects of the product (step 60) according to the selected level of the hierarchy. In practice, the second set comprises the 3D modeled objects of a subtree of the selected level of the hierarchy, the subtree being a tree consisting of the selected level of the hierarchy and descendants of the selected level of the hierarchy. Indeed, the selection of a level may lead to the identification of a node in the simple path from which the level has been identified, and thus, 3D modeled objects of the direct child(s) of the selected level (and therefore of the identified node in the simple path) may be searched and found by traversing the subtree starting from the node of the selected level.

Advantageously, the user-interactive graphical tool may comprise an area in which the three-dimensional modeled objects of the second set are represented. The user is therefore aware of the 3D modeled objects which are found according to the selected level of the hierarchy. FIG. 9 illustrates an embodiment of a user interactive graphical tool which comprises an area 501 having a disk shape. The area may have any shape and may be located, for instance, below the graphical representation of the number of levels.

Referring back to FIG. 1, the user has selected the leaf 191 in the product structure tree 250, and consequently four levels have been identified (which amount to the identification of the nodes 191, 254, 253, and 251 in the simple path between the leaf 191 and the root node 251). Now, if the user selects the third level (which amounts to the identified node 254), then the 3D modeled objects 191-195 are found. If the user selects the first level, that is the root node 251, then the whole set of 3D modeled objects of the product is selected.

Next, the rendering of the displayed 3D modeled objects of the second set is modified, and the 3D modeled objects of the second set are animated (step 70). By this way, the display of the found second set of 3D modeled objects is emphasized and the user can see with ease the different objects of a given level of the product structure.

Inversely, the 3D modeled objects of the second set may be emphasized by modifying the rendering of objects of the set of 3D modeled objects which are not included in the found second set. Typically, the transparency of the set of 3D modeled objects which are not included in the found second set is modified. The transparency is set to a reference value, and the transparency may be selected from a ceil value (half of the reference value) to a floor value (almost transparent). Partial transparency (or translucency) is achieved when transmitting and diffusing light of a position can be only partial or diffuse. The emphasizing of the 3D modeled object may also be carried out thanks to a highlight of the position. A highlight consists in applying on the representation of the position an emissive and light colour. The emphasizing may be performed too via visual effects such blinking of the 3D modeled objects, thickening the outline of the emphasized 3D modeled objects, or increasing a density of points forming the outline of the emphasized 3D modeled objects. In addition, the emphasizing may be performed by animating the objects of the found second set. Typically, the animation of the 3D modeled objects of the second set may be carried out by shaking, vibrating, trembling, and the like, said objects. Any means which allows the user to easily distinguish 3D modeled objects of the second set may be used.

Incidentally, the emphasizing may be automatically performed, e.g. while selecting a level of with the user-interactive graphical tool. The emphasizing may also be manually performed, e.g. upon user action on the user-interactive graphical tool. For instance, as depicted on FIG. 9, the interactive graphical tool may comprise a specific area 506 which causes the found 3D objects of the second set to be emphasized. The specific area 506 may be continually displayed, or it may appear when the level is selected. It may also be located in the user selectable area suitable of the selected level. The user can therefore decide when the 3D modeled objects of the second set are emphasized. In particular, he/she can replay the animation of the 3D objects.

Finally, the user may carry on the navigation in the current hierarchy of product structure by selecting another level of the hierarchy (step 50), or he may start a new navigation in the product structure related to another 3D modeled object of the product by selecting a new 3D modeled object of the product (step 30).

FIGS. 5-8 illustrate the navigation of the product structure of a remote controlled vehicle displayed on FIG. 10.

Figure 5:
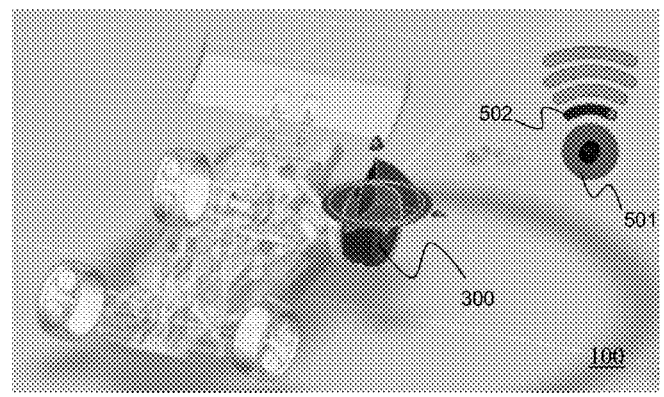
FIGS. 5-8 are schematic views of product structure navigation according to the invention.
Figure 6:
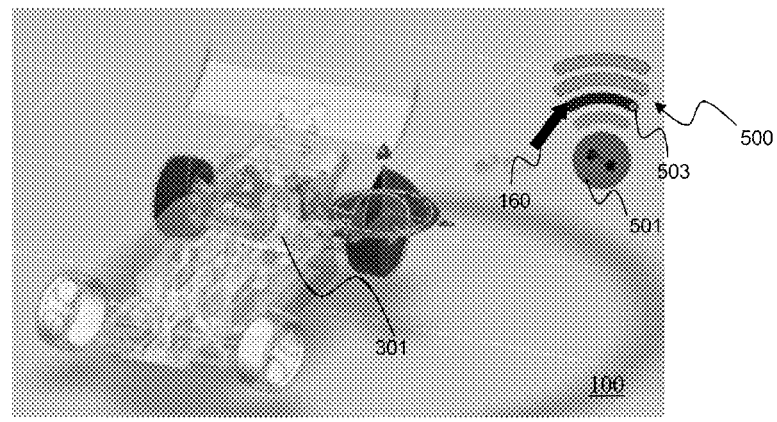

In FIG. 5, the user has selected a wheel of the vehicle. Following the selection of this 3D modeled object, a user interactive graphical tool is displayed in the GUI 100. As the simple path starting from the node which identifies the wheel and stopping to the root node of the product structure comprises four nodes, the user interactive graphical tool comprises, as a result, four levels which are represented by four user interactive arcs. One can notice that the arc 502, which represents the level of the selected wheel, is pre-selected. Furthermore, a graphical representation of the wheel 300 is displayed in the area 501 of the user-interactive graphical tool 500.

Next, the user moves the cursor 160 of the haptic device over the arc 503. The level associated with the arc 503 is therefore selected. A second set of objects is thus found among in the set of 3D modeled object of the vehicle. This second set 301 is mainly comprised of the rear end and the rear wheels of the vehicle. The 3D modeled objects of the second set 301 are emphasized: the rendering of the 3D modeled objects, which do not belong to the second set, is modified such that they are transparent.

Figure 7:
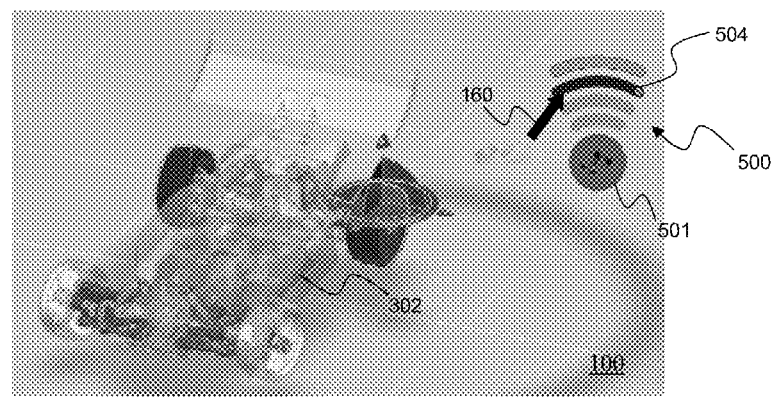
Figure 8:
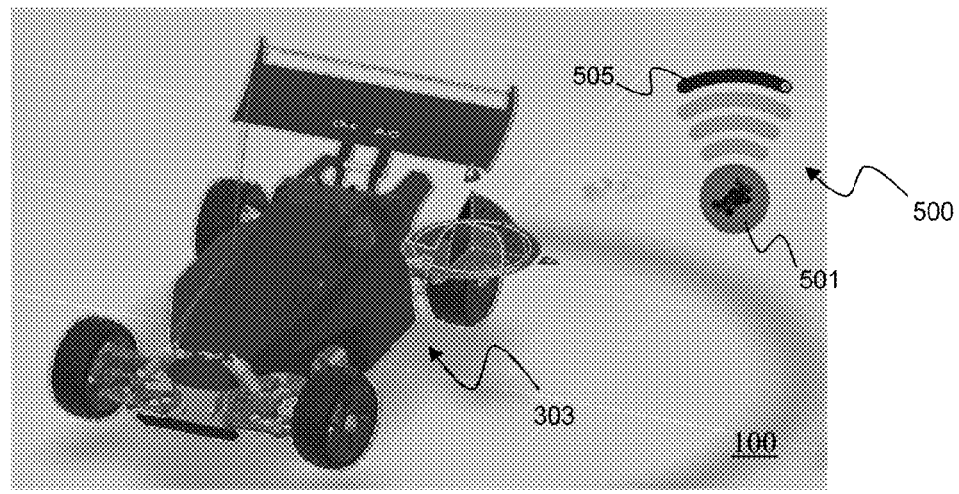

The user carries on exploration of the product structure, places the cursor on the upper level 504 of the product structure, as depicted on FIG. 7. As a result, the rear end, the rear wheels, the front end, the front wheels, and the chassis are emphasized at 302.

Then the user selects the highest level 505 of the product structure. In turn, all the 3D modeled of the product are emphasized, as depicted on FIG. 8. A graphical representation of the product 303 is displayed in the dedicated area 501. The navigation in the product structure is thus carried out without requiring anymore the display of the 2D product structure, as shown on FIG. 10. As less information is displayed, the view of the product in the GUI is made simpler, and the user is less disturb by elements extrinsic to the product.

It is to be understood that the foregoing method can be applied to any product in any configuration capable of being defined by a CAD/CAM/CAE system, or any system used to display a product comprising 3D modeled objects. The invention may be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language.

Figure 11:
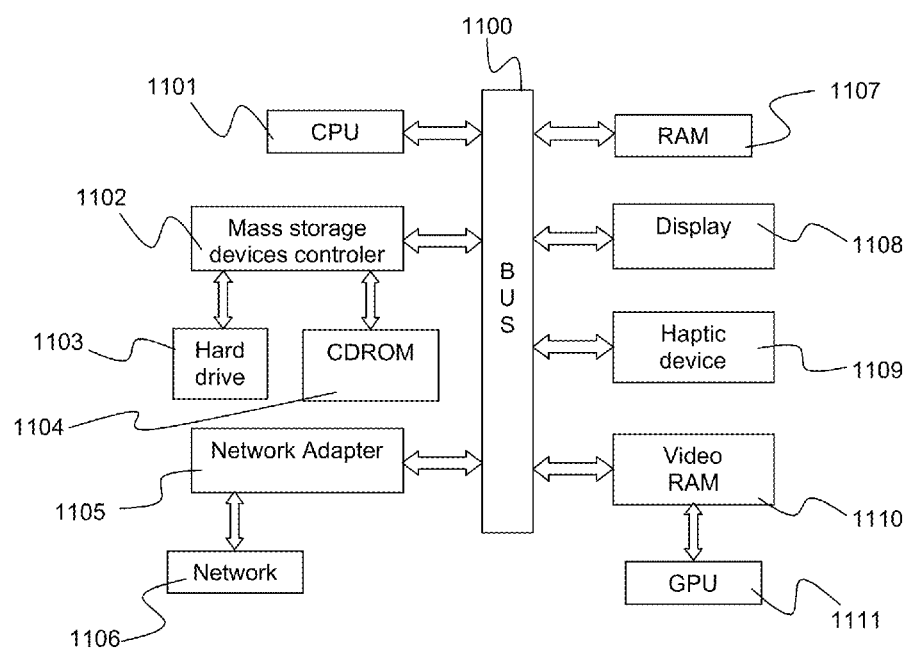
FIG. 11 is a schematic view of a hardware and software environment adapted for carrying out the invention.

FIG. 11 shows a client computer system, e.g. a workstation of a user. The client computer comprises a central processing unit (CPU) 1101 connected to an internal communication BUS 1100, a random access memory (RAM) 1107 also connected to the BUS. The client computer is further provided with a graphical processing unit (GPU) 1111 which is associated with a video random access memory 1110 connected to the BUS. Video RAM 1110 is also known in the art as frame buffer. A mass storage device controller 1102 manages accesses to a mass memory device, such as hard drive 1103. Mass memory devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks 1104. Any of the foregoing may be supplemented by, or incorporated in, specially designed ASICs (application-specific integrated circuits). A network adapter 1105 manages accesses to a network 1106. The client computer may also include a haptic device 1109 such as cursor control device, a keyboard or the like. A cursor control device is used in the client computer to permit the user to selectively position a cursor at any desired location on display 1108. In addition, the cursor control device allows the user to select various commands, and input control signals. The cursor control device includes a number of signal generation devices for input control signals to system. Typically, a cursor control device may be a mouse, the button of the mouse being used to generate the signals.

The preferred embodiment of the present invention has been described. It will be understood that various modifications may be made without departing from the spirit and scope of the invention. Therefore, other implementations are within the scope of the following claims.

While this invention has been particularly shown and described with references to example embodiments thereof, it will be understood by those skilled in the art that various changes in form and details may be made therein without departing from the scope of the invention encompassed by the appended claims.

What is claimed is:

1. A method for navigating in a product structure of a product, the product comprising a set of three-dimensional modeled objects, the method comprising:
   displaying three-dimensional graphical representations of each three-dimensional modeled object forming the product;
   selecting a three-dimensional modeled object of the product among the three-dimensional modeled objects graphically represented;
   determining a number of levels of a hierarchy of the product structure of the product, the number of levels being determined according to levels identified in a simple path in the hierarchy of the product structure between the selected three-dimensional modeled object and a highest level of the hierarchy;

displaying a graphical representation of the number of levels determined of the hierarchy of the product structure of the product;

selecting, on the graphical representation of the number of levels, the number of levels being from the simple path in the hierarchy of the product structure between the selected three-dimensional modeled object and the highest level of the hierarchy, a level among levels identified in the simple path in the hierarchy of the product structure of the product;

finding, in the set of three-dimensional modeled objects, a second set of three-dimensional modeled objects according to the selected level of the hierarchy, the second set comprising the three-dimensional modeled objects of a subtree of the selected level of the hierarchy, the subtree comprising the selected level of the hierarchy and descendants of the selected level of the hierarchy; and emphasizing the display of the found second set of three-dimensional modeled objects.

2. The method of claim 1, wherein the selection of the three-dimensional modeled object of the product is carried out by user acting on the displayed three-dimensional graphical representation of the product with a haptic device.

3. The method of claim 1, wherein the graphical representation of the number of levels is a user-interactive graphical tool.

4. The method of claim 3, wherein the step of selecting a level among levels identified in the simple path in the hierarchy is carried out by the user through the user-interactive graphical tool.

5. The method of claim 4, wherein the user-interactive graphical tool comprises at least one user-selectable area suitable for the selection by the user of a level among levels identified in the simple path in the hierarchy.

6. The method of claim 5, wherein the selection of a level is carried out when a haptic device passes over the user-interactive graphical tool.

7. The method of claim 5, wherein the number of user-selectable area suitable for the selection of a level equals the determined number of levels.

8. The method of claim 3, wherein the user-interactive graphical tool comprises an area in which the three-dimensional modeled objects of the second set are represented.

9. The method of claim 1, wherein the step of displaying a graphical representation of the number of levels comprises displaying a unique graphical representation for each level identified, said unique graphical representation for each level identified being representative of the position of the level in the hierarchy.

10. The method of claim 9, wherein the size of said unique graphical representation for each level identified is representative of the position of the level in the hierarchy.

11. The method of claim 1, wherein the step of emphasizing the display of the found second set of three-dimensional modeled objects comprises modifying a rendering of the objects of the found the second set.

12. The method of claim 1, wherein the step of emphasizing the display of the found second set of three-dimensional modeled objects comprises modifying a rendering of objects of the set of three-dimensional modeled objects which are not included in the found second set.

13. The method of claim 12, wherein modifying the rendering of objects of the set of three-dimensional modeled objects which are not included in the found second set further comprises modifying the transparency of said objects of the set of three-dimensional modeled objects.

14. The method of claim 1, wherein the step of emphasizing the display of the found second set of three-dimensional modeled objects comprises animating the objects of the found second set.

15. The method of claim 14, wherein the animation of the objects of the found second set is carried out by shaking the objects of the found second set.

16. The method of claim 1, wherein the step of emphasizing the display of the found second set of object is carried out upon user actuation on the graphical representation of the number of levels of the hierarchy of the structure of the product.

17. A non-transitory computer-readable storage medium storing instructions that, when executed by a computer, cause the computer to perform a method for navigating in a product structure of a product, the product comprising a set of three-dimensional modeled objects, the method comprising:

displaying three-dimensional graphical representations of each three-dimensional modeled object forming the product;

selecting a three-dimensional modeled object of the product among the three-dimensional modeled objects graphically represented;

determining a number of levels of a hierarchy of the product structure of the product, the number of levels being determined according to levels identified in a simple path in the hierarchy of the product structure between the selected three-dimensional modeled object and a highest level of the hierarchy;

displaying a graphical representation of the number of levels determined of the hierarchy of the product structure of the product;

selecting, on the graphical representation of the number of levels, the number of levels being from the simple path in the hierarchy of the product structure between the selected three-dimensional modeled object and the highest level of the hierarchy, a level among levels identified in the simple path in the hierarchy of the product structure of the product;

finding, in the set of three-dimensional modeled objects, a second set of three-dimensional modeled objects according to the selected level of the hierarchy, the second set comprising the three-dimensional modeled objects of a subtree of the selected level of the hierarchy, the subtree comprising the selected level of the hierarchy and descendants of the selected level of the hierarchy; and emphasizing the display of the found second set of three-dimensional modeled objects.

18. A system for navigating in a product structure of a product, the product comprising a set of three-dimensional modeled objects, the system comprising:

a storage for the set of three-dimensional modeled objects;

a means for displaying to a user a three-dimensional graphical representation of the product; and a processor adapted to carry out a method for navigating said product structure of the product, the method comprising the steps of:

displaying three-dimensional graphical representations of each three-dimensional modeled object forming the product;

selecting a three-dimensional modeled object of the product among the three-dimensional modeled objects graphically represented;

determining a number of levels of a hierarchy of the product structure of the product, the number of levels being determined according to levels identified in a simple path in the hierarchy of the product structure between the selected three-dimensional modeled object and a highest level of the hierarchy;

displaying a graphical representation of the number of levels determined of the hierarchy of the product structure of the product;

selecting a level among levels identified in the simple path in the hierarchy of the product structure of the product between the selected three-dimensional modeled object and the highest level of the hierarchy;

finding, in the set of three-dimensional modeled objects, a second set of three-dimensional modeled objects according to the selected level of the hierarchy, the second set comprising the three-dimensional modeled objects of a subtree of the selected level of the hierarchy, the subtree comprising the selected level of the hierarchy and descendants of the selected level of the hierarchy; and emphasizing the display of the found second set of three-dimensional modeled objects.

\* \* \* \* \*